United States Patent [19]

Kaarmann et al.

[11] Patent Number: 4,686,409

[45] Date of Patent: Aug. 11, 1987

[54] POROUS ADAPTATION LAYER IN AN ULTRASONIC APPLICATOR

[75] Inventors: Hans Kaarmann, Buckenhof; Karl Lubitz, Ottobrunn; Jutta Mohaupt, Munich; Martina Vogt, Fürth; Wolfram Wersing, Kirchheim, all of Fed. Rep. of Germany

[73] Assignee: Siemens Aktiengesellschaft, Berlin and Munich, Fed. Rep. of Germany

[21] Appl. No.: 759,559

[22] Filed: Jul. 26, 1985

[30] Foreign Application Priority Data

Aug. 16, 1984 [DE] Fed. Rep. of Germany ....... 3430161

[51] Int. Cl.[4] .......... H01L 41/08

[52] U.S. Cl. .......... 310/358; 310/326; 310/334; 73/632; 73/642

[58] Field of Search .......... 310/326, 327, 334, 335, 310/358; 367/152; 73/589, 632, 642, 644

[56] References Cited

U.S. PATENT DOCUMENTS

| | | | |
|---|---|---|---|
| 2,430,013 | 11/1947 | Hansell | 177/386 |
| 4,166,967 | 9/1979 | Benes et al. | 310/326 X |
| 4,184,094 | 1/1980 | Kopel | 310/327 X |
| 4,211,948 | 7/1980 | Smith et al. | 310/326 X |
| 4,217,684 | 8/1980 | Brisken et al. | 29/25.35 |
| 4,227,111 | 10/1980 | Cross et al. | 310/358 |
| 4,283,461 | 8/1981 | Wooden et al. | 310/334 X |
| 4,297,607 | 10/1981 | Lynnworth et al. | 310/327 X |
| 4,367,426 | 1/1983 | Kumada et al. | 310/334 X |
| 4,387,720 | 6/1983 | Miller | 73/644 X |
| 4,503,861 | 3/1985 | Entrekin | 73/642 X |
| 4,507,582 | 3/1985 | Glenn | 310/327 |
| 4,523,122 | 6/1985 | Tone et al. | 310/327 X |
| 4,536,673 | 8/1985 | Forster | 310/327 |

FOREIGN PATENT DOCUMENTS

| | | |
|---|---|---|
| 0119855 | 9/1984 | European Pat. Off. . |
| 900298 | 6/1945 | France . |
| 2052917 | 1/1981 | United Kingdom . |

OTHER PUBLICATIONS

"Experimentelle Untersuchungen zum Aufbau von Ultraschallbreitbandwandlern", *Biomedizinische Technik*, vol. 27, Book 7-8, pp. 182-185.

*Primary Examiner*—Peter S. Wong
*Assistant Examiner*—Emanuel Todd Voeltz
*Attorney, Agent, or Firm*—Mark H. Jay

[57] ABSTRACT

A material is disclosed for use as an adaptation layer in ultrasonic transducer units of the type which have a piezo-ceramic transducer. The material is porous, and the acoustic impedance of the material can be adjusted (in one embodiment, to $12\times10^6$ kg/cm$^2$s) by adjusting the porosity of the material. In preferred embodiments, the material is piezo-electric and may have a porosity gradient.

14 Claims, 3 Drawing Figures

POROUS ADAPTATION LAYER IN AN ULTRASONIC APPLICATOR

BACKGROUND OF THE INVENTION

The invention relates to an ultrasonic transducer of the type which has a piezo-electric transducer layer, a first adaptation layer coupled to the piezo-electric transducer layer, and a second adaptation layer which is coupled to the first adaptation layer and in operation is turned toward an object to be examined.

Ultrasonic transducers of this kind are widely used in medical technology to obtain information about the internal structures of tissues and organs in a patient. One problem area is how to introduce the ultrasonic waves into the patient.

The piezo-electric transducer used in medical ultrasonic antennas is often made of a material which has a relatively high acoustic impedance. Such materials as lead-zirconate-titanate ceramics have, for example, an acoustic impedance of about $30\times10^6$ kg/m$^2$s. The patient's skin and tissue, however, has only an acoustic resistance of about $1.5\times10^6$ kg/m$^2$s. To avoid an undesirably large reflection at the interface between the piezo-electric transducer layer and human tissue, an adaptation (or impedance-matching) layer is disposed between the transducer and tissue.

A single adaptation layer of a plastic with an acoustic impedance of about $3\times10^6$ kg/m$^2$s or slightly more has been used to match the acoustic impedance of the ceramic transducer to that of the object to be examined (e.g. human tissue with an impedance of about $1.5\times10^6$ kg/m$^2$s). This adaptation layer had a thickness of $\lambda/4$, $\lambda$ being the wavelength that exists in the material in accordance with the nominal frequency of the ultrasonic transducer. A theoretically favorable value is $7\times10^6$ kg/m$^2$s when transforming down from $30\times10^6$ kg/m$^2$s (ceramic) to $1.5\times10^6$ kg/m$^2$s.

The disadvantage of using a single adaptation layer is that the bandwidth is not wide enough. To obtain high penetration depths and good axial resolution over a large frequency range, a first and a second adaptation layer of $\lambda/4$ thickness each have been used (cf. Biomedizinische Technik, Volume 27, No. 7-8, 1982, p. 182-185). The acoustic impedances of these two adaptation layers are about $12\times10^6$ kg/m$^2$s for the first adaptation layer (which faces the piezo-electric ultrasonic transducer) and about $4.2\times10^6$ kg/m$^2$s for the adaptation layer which faces the tissue or patient. Thus a much better adaptation can be obtained.

Materials for the second adaptaton layer with an acoustic impedance of about $4.2\times10^6$ kg/m$^2$s are easy to find or to produce. Common plastics may be used. Since the impedance of the second (plastic) adaptation layer advantageously to be used is substantially independent of the impedance of the ultrasonic transducer ceramic, the impedance once selected is equally suitable for all PZT ceramics of the ultrasonic transducer.

On the other hand, it is difficult to find materials for the first adaptation layer. This should have a mean acoustic impedance that should to some degree be adjustable because of its (theoretically corroborated) dependence on the impedance of the piezoceramic piezo-electric transducer layer with which it is used. Under the conditions named it should be about $12\times10^6$ kg/m$^2$s. With natural materials such an acoustic impedance is difficult to obtain. Gases and liquids, for instance, are in the range of 0 to $4\times10^6$ kg/m$^2$s. Above the last-named value there is a certain gap, i.e. materials with such an impedance are practially non-existent, and the values of minerals, metals, etc. range between 14 and about $100\times10^6$ kg/m$^2$s. Materials having acoustic impedance of around $12\times10^6$ kg/m$^2$s can be fabricated only with great difficulty, using glass compounds. As a rule, borosilicate glass is used. The use of this and other glasses, however, entails a number of disadvantages. The fabrication of glass is time-consuming and expensive. Moreover, some glasses are toxic in the impedance range in question; they must therefore be treated before they can be used. It has now been found that the first adaptation layer has an especially great influence on the quality of the ultrasonic picture.

One object of the invention is to provide a material for a first adaptation layer which can be adjusted to a desired acoustic impedance during manufacture and which has mechanical properties that permit relatively easy fabrication.

SUMMARY OF THE INVENTION

According to the invention, the first adaptation layer is made of a porous piezoceramic material. Its porosity is selected so that, at a layer thickness of $\lambda/4$, the material has an acoustic impedance with a value between that of the piezo-electric transducer and that of the second adaptation layer. $\lambda$ is the wavelength of the ultrasonic wave in the first adaptation layer at its nominal frequency.

Because the acoustic impedance of the ceramic material is dependent on its porosity, it is easy to adjust the acoustic impedance during manufacture. Depending on whether the pore quantity and/or pore size is increased or reduced in a controlled manner, there results a lower or higher acoustic impedance. A value in the critical range of around $12\times10^6$ kg/m$^2$s can easily be selected by varying the porosity. It has been found advantageous to produce a whole series of e.g. 10 porous ceramic adaptation layers which cover the range around $12\times10^6$ kg/m$^2$s in fine gradations of e.g. $0.2\times10^6$ kg/m$^2$s. All these adaptation layers have a layer thickness of $\lambda/4$. It can then be determined by trial and error which of these 10 adaptation layers results in the best match for the existing piezo-electric transducer.

Since the base material for the first adaptation layer is a ceramic, it is easy to fabricate, turn, mill, glue and grind.

In an especially advantageous embodiment, the porous ceramic material is piezo-electric and is chemically similar to the material used for the transducer. In this case, the coefficient of thermal expansion of the adaptation layer approximates that of the piezo-electric transducer. The piezo-electric properties of the porous ceramic are not critical when the material is used as transformation layer.

In another advantageous embodiment, the acoustic impedance of the first adaptation layer has a gradient with a positive slope in the direction of the piezo-electric transducer. By this measure the acoustic impedance of the first adaptation layer can have a continuous transition from about $30\times10^6$ kg/m$^2$s down to about $4\times10^6$ kg/m$^2$s, i.e. the value desired for the second adaptation layer. This makes the frequency band of the ultrasonic transducer still wider than it would be if two adaptation layers were used.

BRIEF DESCRIPTION OF THE DRAWINGS

Exemplary and non-limiting preferred embodiments of the invention are shown in the drawings, in which.

DETAILED DESCRIPTION OF THE PREFERRED EMBODIMENTS

Figure 1:
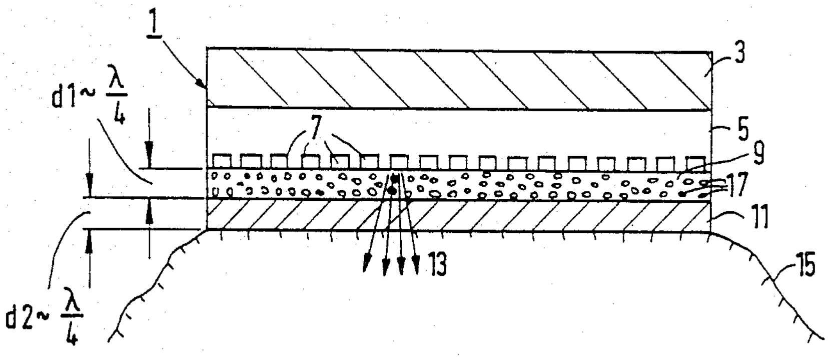
FIG. 1 illustrates a preferred embodiment of the invention in use.

FIG. 1 shows an ultrasonic transducer 1. This has four layers: an attenuation layer 3, a layer 5 in which a number of piezo-electric transducer elements 7 are embedded and which will be hereinafter referred to as a "piezo-electric transducer", a first adaptation layer 9, and a second adaptation layer 11. The piezo-electric transducer elements 7 radiate pulse-type acoustic waves 13 in the ultrasonic range in the direction of the first and second adaptation layers 9 and 11. The acoustic waves 13 are advantageously introduced into an object to be examined, in this instance a patient 15, with the least possible hindrance. If upon transition to the patient 15 the acoustic waves 13 impinge on boundary faces of materials of different acoustic impedance, they are to some degree reflected therefrom, resulting in undesired side effects. To avoid this, the two adaptation layers 9, 11 are provided. The first adaptation layer 9 has an acoustic impedance of about $12\times10^6$ kg/m$^2$s, representing a mean value between the impedance of the piezo-electric transducer elements 7 (about $Z_K=30\times10^6$ kg/m$^2$s) and the impedance of the second adaptation layer 11 (about $Z_2=4\times10^6$ kg/m$^2$s). The second adaptation layer 11 in turn has a value $Z_2$ between the acoustic impedance $Z_1$ of the first adaptation layer 9 and the acoustic impedance $Z_g$ of the patient's tissue, which is approximately $Z_g=1.5\times10^6$ kg/m$^2$s. The material for the piezo-electric transducer material is preferably a ceramic of lead-zirconate-titanate. It has a relatively high impedance, namely $Z_K=34\times10^6$ kg/m$^2$s.

The values for the adaptation layers 9, 11 are approximated from the formulas $$Z_1=(Z_k^2\times Z_g)^{\frac{1}{3}} \text{ and } Z_2=(Z_K\times Z_g^2)^{\frac{1}{3}},$$

where $Z_1$ is the acoustic impedance of the first adaptation layer 9; $Z_2$ the impedance of the second adaptation layer 11; $Z_K$ the acoustic impedance of the piezo-electric transducer 7; and $Z_g$ that of the tissue at the coupling point.

The desired value $Z_1$ of the acoustic impedance of the first adaptation layer 9 lies in a range which is difficult to obtain in natural materials. For this reason, the first adaptation layer 9 is made of a material of comparatively high impedance which is provided with cavities or pores 17 which alter the acoustic properites of the selected material, as by reducing the impedance. Preferably a porous ceramic is chosen for the first adaptation layer 9. It fabricates well and easily. The layer thickness of the adaptation layers 9 and 11 is $\lambda/4$ in each instance, $\lambda$ being the wavelength of the ultrasonic wave in the adaptation layers 9, 11. It corresponds to the frequency with which the piezo-electric transducers 7 are excited.

During manufacture of the ultrasonic transducer 1 it is often impossible to know in advance the proper value for the acoustic impedance of the first adaptation layer 9. This value depends, among other things, on the acoustic impedance $Z_K$ of the piezo-electric transducer elements 7 themselves, and this impedance has a certain scatter. This value also depends on the impedance of the second adaptation layer 11, which is preferably made of plastic and can also vary in its value. It is desirable, therefore, to have available a number of first adaptation layers 9, with varying acoustic impedances. It can then be determined by experiments with the ultrasonic transducer 1 which of these adaptations layers 9 is suitable for permanent installation in the respective ultrasonic transducer 1.

To obtain this adjustment and gradation of the acoustic impedance $Z_1$, the first adaptation layer 9 is provided with uniformly distributed pores 17. The mean density and/or size of the pores 17 can be varied during their production, so that the acoustic impedance $Z_1$ assumes different values in a controlled manner. In this way an assortment of finely graded first adaptation layers 9 can be produced, from which the most favorable one is then selected.

Figure 2:
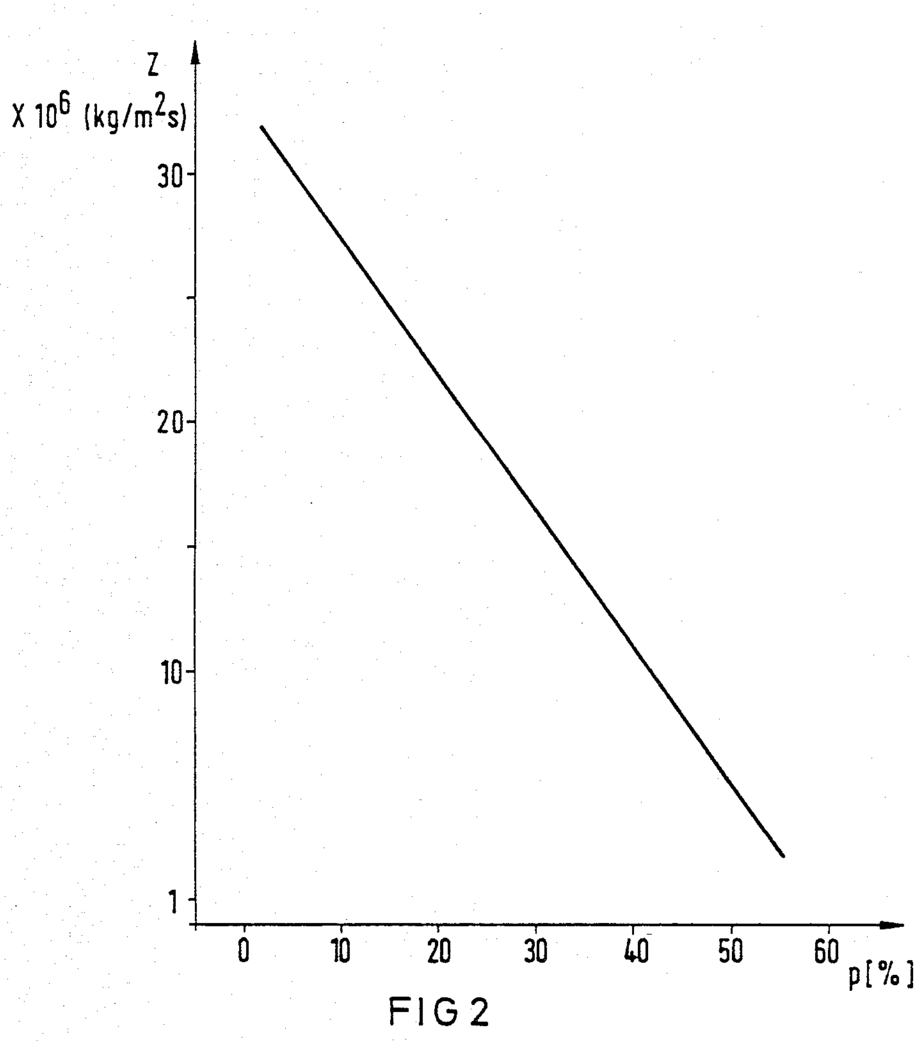
FIG. 2, a plot of the curve of the acoustic impedance as a function of the pore quantity.

FIG. 2 shows a diagram in which the acoustic impedance of the first adaptation layer 9 is plotted versus the pore proportion or porosity (in %) in the first adaptation layer 9. Here the first adaptation layer 9 consists preferably of lead-zirconate titanate ceramic. Alternatively, another material with values in the desired impedance range may be selected. In the diagram of FIG. 2, the desired acoustic impedance of about $12\times10^6$ kg/m$^2$s is obtained at a porosity of approximately 36%. By varying this percentage in the range ±2%, the acoustic impedance can be varied e.g. between 11 and $13\times10^6$ kg/m$^2$s. By small changes in porosity e.g. on the order of 1%, it is thus possible to obtain a fine gradation of the acoustic impedance $Z_1$ of the first adaptation layer 9.

The frequency constants of the various complex ceramic systems to be considered (solid solutions, "mixed crystals") based on e.g. $PbTiO_3$ and $PbZrO_3$, and mixed with a second complex oxide such as $Pb(Mg_{1/3}Nb_{2/3})O_3$ with possibly additional doping substances, differ little from one another. By adjusting the porosity during manufacture, it is therefore possible to produce for each transducer ceramic compound a first adaptation layer 9 having the desired acoustic impedance of about $12\times10^6$ kg/m$^2$s.

All of the above mentioned complex ceramic systems have the further advantage that they possess piezo-electric properties. This is of importance especially with respect to the thermal expansion of the first adaptation layer 9, which must be adapted to that of the piezo-electric transducer elements 7. If both the piezo-electric transducer elements 7 and the first adaptation layers 9 are made of a piezo-ceramic material, their coefficients of thermal expansion will be so close together that the first adaptation layer 9 can be adapted, as by addition of dopants, as to the thermal expansion of the piezo-electric transducer elements 7. This prevents mechanical stresses with fissuration or even rupture at the boundary layer. The porous first adaptation layer 9, which is produced on the basis of a piezo-electric material, has a coefficient of thermal expansion of perhaps between 1 and 10 ppm/K.

Figure 3:
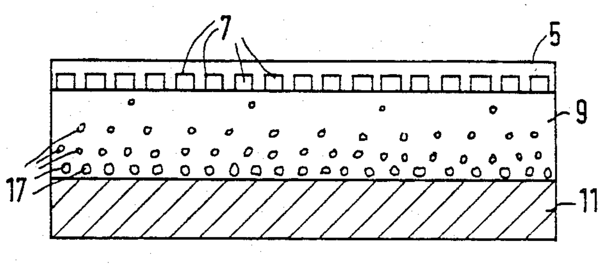
FIG. 3, an adaptation layer with continuously varied porosity.

FIG. 3 shows a first adaptation layer 9 in which the density of the pores 17 is distributed differently. There are more pores 17 toward the second adaptation layer 11 than toward the top side which is contiguous to the piezo-electric transducer 5. This different pore density, i.e. the pore concentration and/or size diminishing toward the top, also brings about a different acoustic impedance, which in the course of the first adaptation layer 9 decreases from the top downwardly (gradient). It is thus possible to form the first adaptation layer 9 in such a way that at its top side, or boundary layer toward the piezo-electric transducer 7, it has an acoustic impedance $Z_K$ of about $30\times10^6$ kg/m$^2$s, and at its bottom side, directed toward the second adaptation layer 11, an acoustic impedance of about $4\times10^6$ kg/m$^2$s. It is possible, therefore, to produce the first adaptation layer 9 so that its acoustic impedance $Z_1$ varies continuously toward the top, between two desired values. An adaptation layer 9 of this kind with an impedance gradient results in an especially wide-band adaptation.

The porosity gradient can be achieved e.g. by producing the adaptation layer by a foil pouring method. To the slip is added pearl polymer, which segregates due to gravity. Different gradients can be adjusted both through the viscosity of the slip for the foil of the first adaptation layer 9 and through the course of the subsequent sintering.

Here again it is advantageous to produce a number of first adaptation layers 9 of different impedance gradient and to decide afterward by trial and error which of them is suitable for installation in the ultrasonic transducer 1. Such finding of the suitable first adaptation layer 9 is desirable because a plurality of criteria must be taken into consideration, the mutual influences and interactions of which can be determined only by experiment. Thus, for each first adaptation layer 9 it should be tested, for example, how the sensitivity of the ultrasonic transmitter or receiver is affected, the pulse form of the transmitter pulse, the pulse length thereof, phase jumps, etc. Besides these criteria, which influence the image quality, also the coefficient of thermal expansion and the layer thickness of the first adaptation layer 9, which always can correspond to $\lambda/4$ only approximately, are determining.

Those skilled in the art will understand that changes can be made in the preferred embodiments here described, and that these embodiments can be used for other purposes. Such changes and uses are within the scope of the invention, which is limited only by the claims which follow.

What is claimed is:

1. In an ultrasonic transducer unit of the type which has a piezo-ceramic transducer, a first adaptation layer coupled to the piezo-ceramic transducer and a second adaptation layer which is coupled to the first adaptation layer and an object to be examined, the improvement comprising a first adaptation layer of a porous piezo-ceramic material with a porosity selected such that when the first adaptation layer is one quarter wavelength thick at a nominal frequency of the piezo-ceramic transducer, the first adaptation layer has an acoustic impedance which is between the acoustic impedance of the piezo-ceramic transducer and the second adaptation layer.

2. The improvement of claim 1 wherein the piezo-ceramic material comprises a mixed crystal containing $PbTiO_3$ and $PbZrO_3$.

3. The improvement of claim 2, wherein the mixed crystal further comprises an additional complex oxide.

4. The improvement of claim 3, wherein the complex oxide comprises $Pb(Mg_{1/3}Nb_{2/3})O_3$.

5. The improvement of claim 2, wherein the piezo-ceramic material contains a dopant.

6. The improvement of claim 1, wherein the first adaptation layer has an acoustic impedance between $11\times10^6$ kg/m$^2$s and $13\times10^6$ kg/m$^2$s.

7. The improvement of claim 1, wherein the acoustic impedance of the first adaptation layer varies in a manner that said acoustic impedance is at a maximum adjacent said piezo-ceramic transducer and at a minimum adjacent said second adaptation layer.

8. The improvement of claim 1, wherein said piezo-ceramic material has a thermal coefficient of expansion which is approximately matched to the thermal coefficient of expansion of the piezo-ceramic transducer.

9. The improvement of claim 1 wherein the second adaptation layer is a quarter-wavelength thick and is of a plastic material.

10. An adaptation layer for use with piezo-ceramic transducers, comprising a porous piezo-ceramic material, the porosity of the porous piezo-ceramic material having a gradient.

11. An adaptation layer for use with piezo-ceramic transducers, comprising a porous piezo-ceramic material which is a mixed crystal.

12. The layer of claim 10, wherein the mixed crystal comprises $PbTiO_3$ and $PbZrO_3$.

13. The layer of claim 12, wherein the mixed crystal further comprises a complex oxide.

14. The layer of claim 13, wherein the complex oxide is $Pb(Mg_{1/3}Nb_{2/3})O_3$.

* * * * *